(12) United States Patent
Chen

(10) Patent No.: US 6,483,715 B1
(45) Date of Patent: Nov. 19, 2002

(54) CIRCUIT BOARD COUPLED WITH JACKS

(75) Inventor: Michael Chen, Taipei (TW)

(73) Assignee: Surtec Industries Inc., Taipei (TW)

( * ) Notice: Subject to any disclaimer, the term of this patent is extended or adjusted under 35 U.S.C. 154(b) by 0 days.

(21) Appl. No.: 09/989,419

(22) Filed: Nov. 21, 2001

(51) Int. Cl.$^7$ ................................................. H05K 1/16
(52) U.S. Cl. ........................ 361/760; 361/701; 361/763; 439/941
(58) Field of Search ................................. 361/760, 761, 361/763; 439/576, 76.1, 620, 676, 941; 333/4

(56) References Cited

U.S. PATENT DOCUMENTS

| | | | |
|---|---|---|---|
| 5,069,641 A | * 12/1991 | Sakamoto et al. | ........... 333/182 |
| 5,326,284 A | * 7/1994 | Bohbot et al. | ............... 439/607 |
| 5,350,324 A | * 9/1994 | Guilbert | ...................... 379/417 |
| 5,435,752 A | 7/1995 | Siemon et al. | |
| 5,864,089 A | 1/1999 | Rainal | |
| 6,089,923 A | * 7/2000 | Phommachanh | ............ 439/676 |
| 6,356,162 B1 | * 3/2002 | DeFlandre et al. | ....... 333/24 R |

* cited by examiner

*Primary Examiner*—Kamand Cuneo
*Assistant Examiner*—Tuan Dinh
(74) *Attorney, Agent, or Firm*—Birch, Stewart, Kolasch & Birch, LLP

(57) ABSTRACT

A circuit board coupled with jacks and conformed to Category 6 standard has conductors to connect IDC contacts and jack pins to reduce cross-talk and improve return-loss. The improvements are targeted on the pair 1 and 3 conductors of circuit conductors, and include forming capacitors by main conductors connecting to the IDC and jack on two sides of the circuit board, extending pair 1 and 3 conductor ends in the vicinity of IDC junctures to form a TR (or TT,RR) conductor layout, and extending pair 1 and 3 conductor ends in the vicinity of jack junctures to form a TT or RR conductor layout (or TT for IDC end, or RR for jack end) to generate induction effect, thereby to form the circuit board coupled with jacks that has circuit conductors laid on two sides thereof and conforms to Category 6 communication standard.

14 Claims, 10 Drawing Sheets

CIRCUIT BOARD COUPLED WITH JACKS

FIELD OF THE INVENTION

The invention relates to a circuit design for patch panels and particularly a circuit design for a dual-side circuit board coupled with jacks and Insulation Displacement Connectors (IDCs) to conform to Category 6 (Cat.6) communication standard.

BACKGROUND OF THE INVENTION

In order to respond the growing applications of high speed networks post-Ethernet 100 MHz networks, working groups in Telecommunications Industry Associations (TIA) of U.S.A. has developed and announced an Enhanced Cat. 6 standard based on the wiring system of Category 5 (Cat. 5) 100 MHZ (titled: TSB-67). The Cat. 6 standard expands from 100 MHZ of Cat. 5 to 250 MHZ. In 1998 IEEE made a request to TIA and ISO on new wiring system specifications, performance requirements must be at least 25% more than the accumulated power fading cross-talk ratio (ACR). Hence test frequency for Cat. 6 performance has even reached 350 MHZ. The major difference between the Cat. 6 standard and the Cat. 5 standard is that Cat. 6 standard has improved performance in cross talk interference and return loss. In the new generation of full duplex high speed network applications, improved performance on return loss is very important. Cross talk is a critical factor for implementing wide band applications. Although 00 MHZ is still the mainstream of the present network installations, Cat. 6 standard is a more desirable protocol to meet future requirements.

The standard set forth above is not only targeted on high speed communication cables, in order to maintain same high speed transmission performance in the high speed communication networks, the peripheral devices related to the high speed communication cables also should have matching designs, especially telecommunication connection elements such as RJ-45 type plug and jack. The RJ-45 connectors (including plug and jack) used in high speed communication networks generally are 8P8C type. 8P means eight positions, and 8C means eight gold plated contacts. However, in practical applications, only two pairs of lines are used. Other two pairs of lines may be used for other devices such as telephones and facsimile machines. There are two types of connector specifications according to EIA/TIA definitions, i.e. EIA/TIA-568A and EIA/TIA-568B. EIA/TIA-568A is obsolete now. EIA/TIA-568B is continuously being used. Its pin positions 1–8 are arranged sequentially and are connected respectively with four pairs of twisted communication lines (such as Unshielded Twisted Pair or Shielded Twisted Pair). The pin positions are respectively marked by T (Tip terminal) and R (Ring terminal) according to different current directions. The general standard communication cable lines have four twisted pairs twisted in pairs and marked by different colors. The colors of the cable lines are blue/white-blue, orange/white-orange, green/white-green, and brown/white-brown.

In the circuits of these communication connecting devices, to include capacitors or induction effect to reduce cross-talk and improve return-loss is a well-known technique. For instance, U.S. Pat. No. 5,864,089 to Rainal, entitled: "Low-crosstalk modular electrical connector assembly", and U.S. Pat. No. 5,435,752 to John Siemon et al, entitled: "Electrically Balanced Connector Assembly" disclose circuit structures that have circuit conductors laid on the circuit board surface equivalent to capacitors or inductors. They mainly deploy selected circuit conductors on the surface of two sides of the circuit board to form capacitors, or lay circuit conductors adjacent to each other at a selected interval on the surface of the same side of the circuit board to generate induction effect. While they can reduce cross-talk and improve return-loss to some degree, they still cannot meet the critical requirements of Cat. 6 standard.

SUMMARY OF THE INVENTION

The primary object of the invention is to provide a circuit board conforming to Cat. 6 standard to improve cross-talk and return-loss of jacks mounted to the circuit board.

Another object of the invention is to provide a circuit board that has a simple circuit design and particularly a circuit board coupled with jacks and IDCs.

The circuit board coupled with jacks according to the invention mainly is targeted on the improvement of the pair 1 conductors and pair 3 conductors of the jack and IDC. The improvements include: the main conductors between the jack and IDC are laid respectively on two sides of the circuit board and have enlarged areas such that a capacitor structure is formed between the pair 1 conductors and the pair 3 conductors. In the vicinity of the juncture of the IDC and main conductor, the ends of the pair 1 and pair 3 conductors are extended and lengthened to allow the pair 1 and pair 3 conductors forming a TR (or TT, RR) layout related to each other, and in the vicinity of the juncture of the jack and main conductor, the ends of the pair 1 and pair 3 conductors are extended and lengthened to allow the pair 1 and pair 3 conductors forming a TT or RR (or TT or RR for the IDC end, and TR for the jack end) layout, thereby to generate induction effect. By means of the balanced effect resulting from multiple levels of capacitance and inductance, cross-talk interference can be reduced to meet the requirements of Cat. 6 standard.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1A:
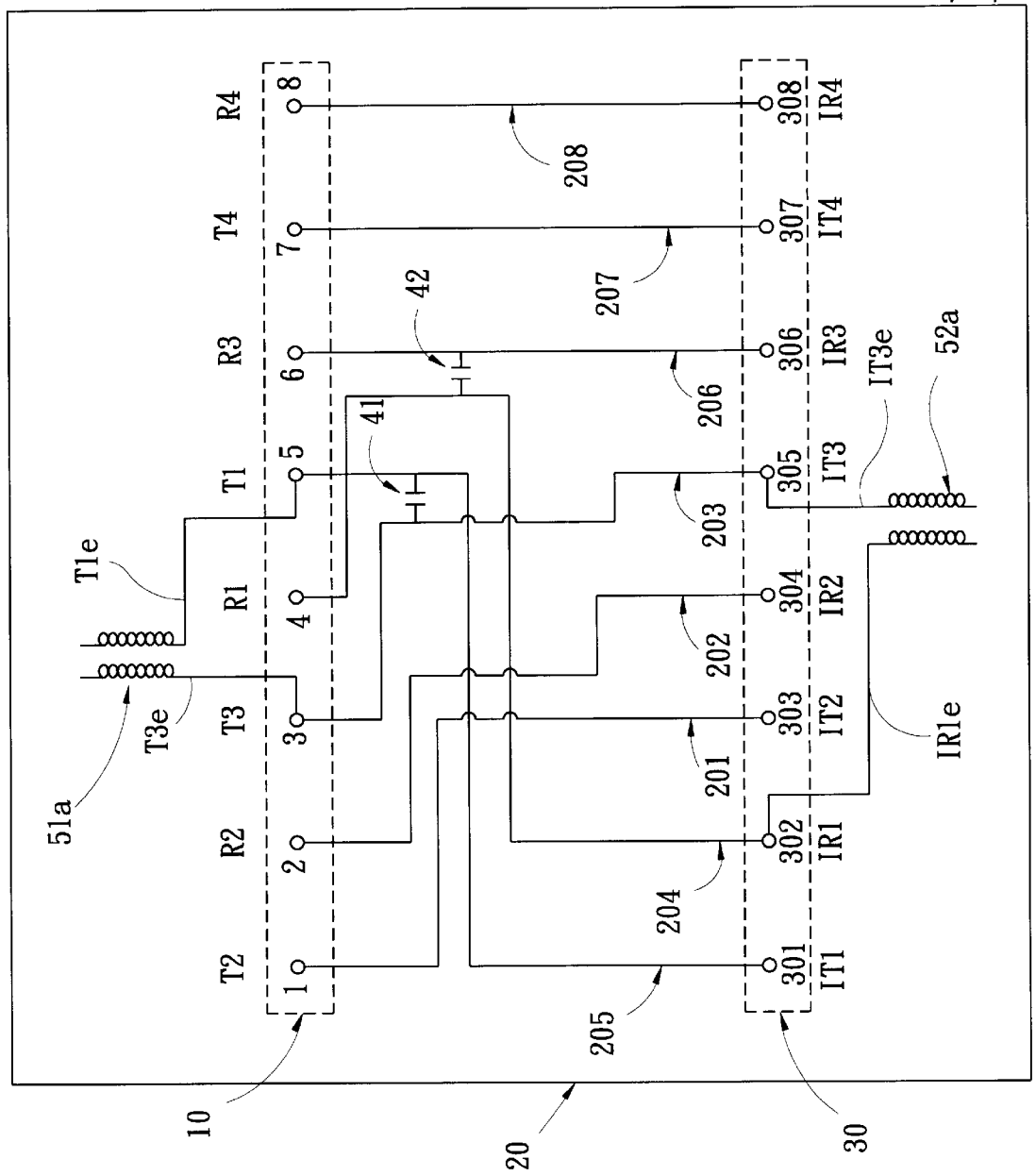
FIGS. 1A and 1B are equivalent circuit diagrams of a first embodiment of the invention.
Figure 1B:
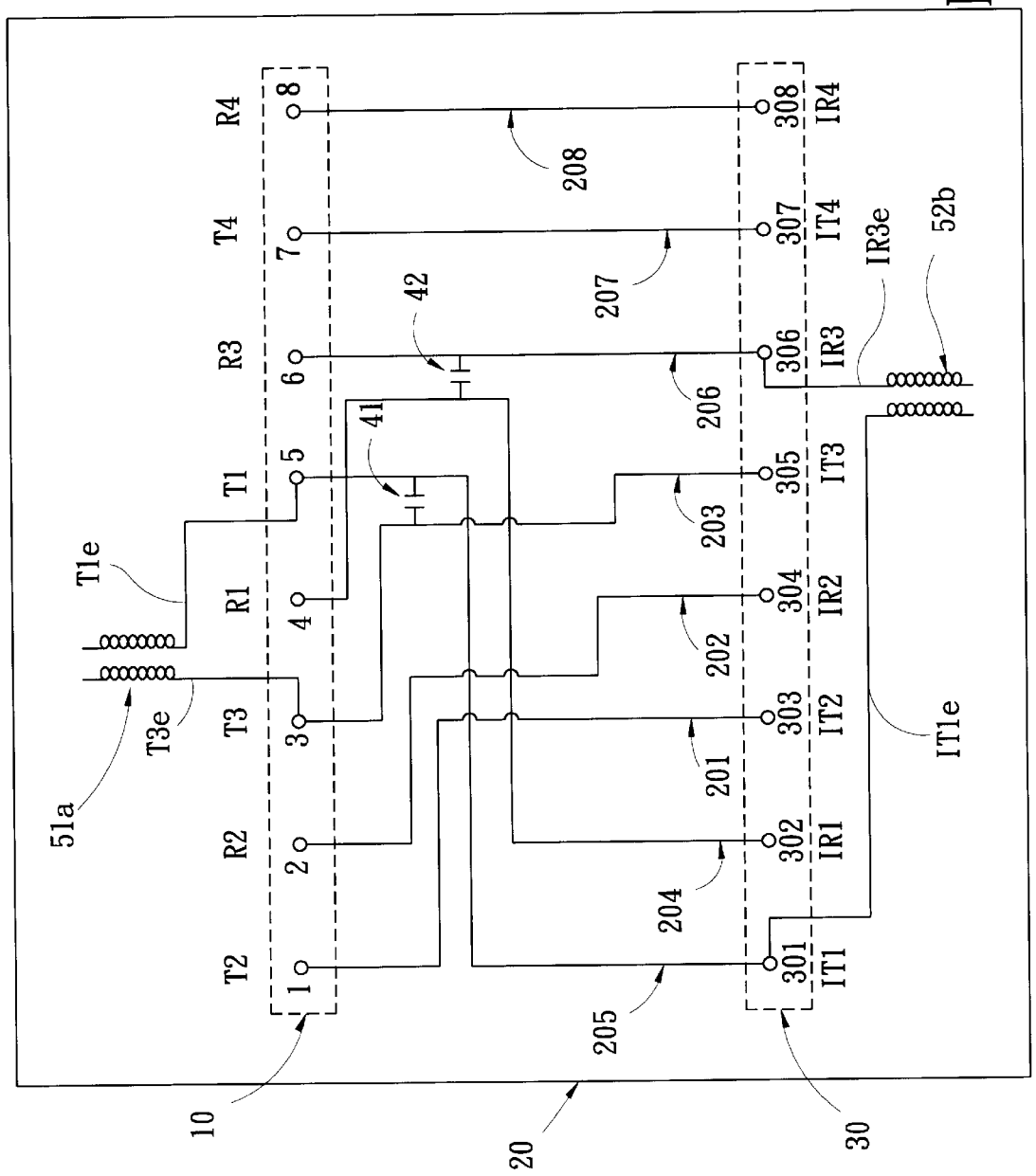

Referring to FIGS. 1A and 1B, a circuit board 20 of the invention has a jack 10 and an IDC 30 mounted thereon. The jack 10 is connected to the IDC 30 through main conductors 201–208 laid on two sides of the circuit board 20.

The jack 10 has eight pins 1–8 arranged from left to right in sequence, and are grouped to four pairs according to Table 1 shown below. The fifth and fourth pins are pair 1, the first and second pins are pair 2, the third and sixth pins are pair 3, and the seventh and eighth pins are pair 4. The four pairs of pins (pairs 1–4) are connected respectively to twisted pairs of different colors of communication cable lines to form desired polarity relationships (i.e. current directions) as shown in Table 1.

TABLE 1

| (PAIR) | (PIN.-TERMINALS) | (TIP/RING) | (POLARITY) | COLOR |
|---|---|---|---|---|
| I | 5 | T1 | + | White/Blue |
|  | 4 | R1 | − | Blue |
| II | 1 | T2 | + | White/Orange |
|  | 2 | R2 | − | Orange |
| III | 3 | T3 | + | White/Green |
|  | 6 | R3 | − | Green |
| IV | 7 | T4 | + | White/Brown |
|  | 8 | R4 | − | Brown |

To make the descriptions consistent, the pins will be indicated by their polarity and pair number in the following discussion, i.e. pins 5, 4 of pair 1 will be shown by T1, R1; pins 1, 2 of pair 2 will be shown by T2, R2; pins 3, 6 of pair 3 will be shown by T3, R3; and pins 7, 8 of pair 4 will be shown by T4, R4. IDC 30 also has eight contacts 301–308 from left to right in sequence. Every two neighboring contacts are grouped in a pair to form four pairs from left to right. The contacts 301–308 of the four pairs are connected respectively to the pins 1–8 through the main conductors 201–208 laid on two sides of the circuit board 20 defined in Table 1. For the sake of consistence, the contacts 301–308 also are grouped and marked to match the pins, i.e. contacts 301, 302 of pair 1 are shown by IT1, IR1; contacts 303, 304 of pair 2 are shown by IT2, IR2; contacts 305, 306 of pair 3 are shown by IT3, IR3; and contacts 307, 308 of pair 4 are shown by IT4, IR4. (Where the prefixed I represents the IDC 30 to distinguish with the pins T1–T4, R1–R4 of the jack 10).

According to the technique of the invention, the conductors on the circuit board 20 for connecting the pins T1.R1 of pair 1 and pins T3, R3 of pair 3 (including the main conductors 203–206 are arranged in a selected layout on the circuit board 20 to form equivalent capacitor and inductor structures. These specially arranged capacitors and inductors allow the jack 10 to reduce cross-talk and improve return-loss.

According to the technique of the invention, when actually producing the circuit structure on the surface of the circuit board 20, at least one or both of a first capacitor 41 and a second capacitor 42 is required. Depending on layout configurations, three different embodiments may be formed. The preferred choice is to include the first capacitor 41 and the second capacitor 42 concurrently. The inductors for connecting the pins of the jack 10 and contacts of the IDC 30 will be arranged and matched according to the following rules to get desired mutual polarity relationship:

A. through a pair of parallel and close extension conductors connecting to the contacts of the IDC 30 to form an inductor with TR (or TT, RR) polarity; and B. through a pair of parallel and close extension conductors connecting to the pins of the jack 10 to form an inductor with TT or RR polarity (the inductor polarity will be TT or RR in the vicinity of the IDC, and TR in the vicinity of the jack). Based on the foregoing rules, the polarity relationships of various embodiments of the invention are shown in Table 2 below:

TABLE 2

| Embodiment | Inductor polarity connecting to Jack end | Inductor polarity connecting to IDC end |
|---|---|---|
| First | TT | TR |
| Second | RR | TR |
| Third | TR | TT |
| Fourth | TR | RR |

Practical circuit designs of the capacitor and inductor will be discussed below accompanying the drawings. To differentiate from the capacitor, the inductor connecting to the jack end will be called first inductor, while the inductor connecting to the IDC end will be called second inductor.

Referring to FIGS. 1A and 1B for the first embodiment:

1. Capacitor structure: the capacitors are formed by enlarging a portion of the main conductors 205, 204 of pair 1 and the main conductors 203, 206 of pair 3 located respectively on two sides of the circuit board 20, and include a first capacitor 41 formed by coupling the main conductors 203 and 205, and a second capacitor 42 formed by coupling the main conductors 206 and 204.

Figure 2B:
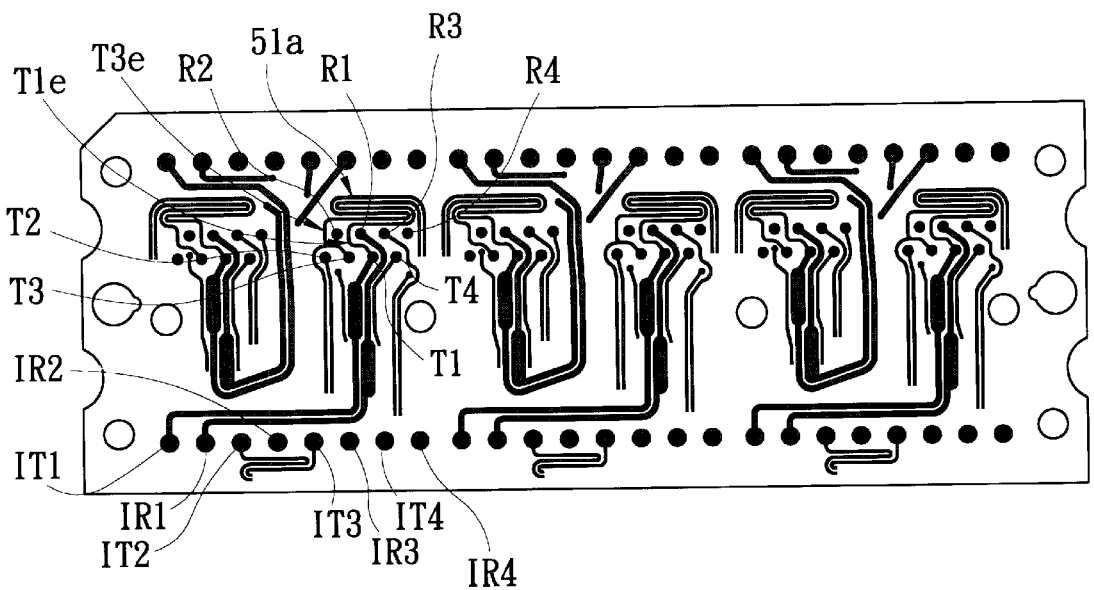
FIG. 2B is a fragmentary circuit layout according to FIG. 1, showing a circuit layout on a negative side of the circuit board.
Figure 2A:
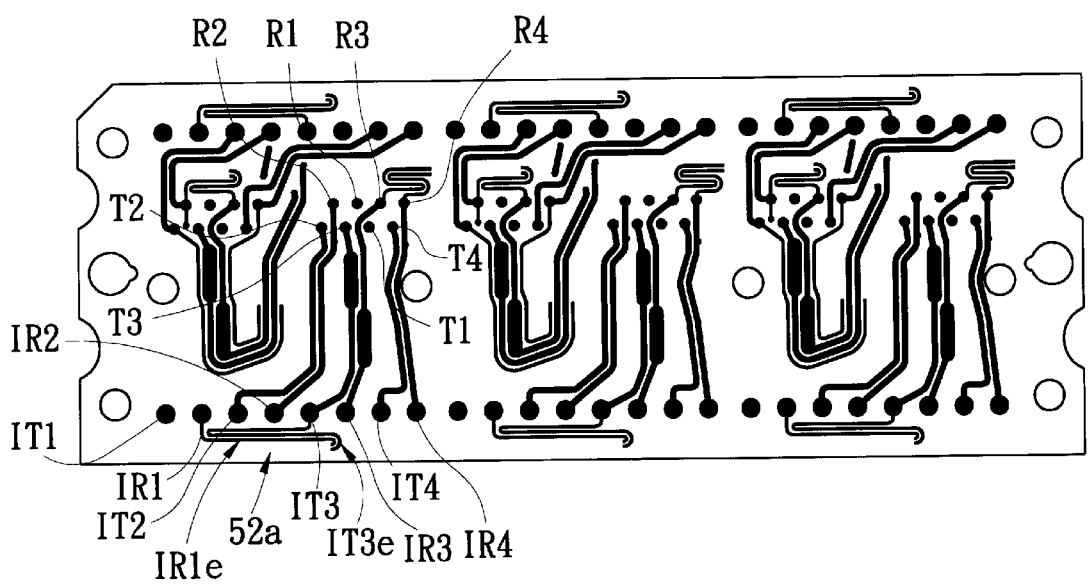
FIG. 2A is a fragmentary circuit layout according to FIG. 1, showing a circuit layout on a positive side of the circuit board.

2. The inductor structure connecting to the jack 10: it is formed by extending a section of a pair of parallel conductors connecting to two pins of the jack 10 with TT polarity. A first inductor 51a is formed by a section of extension conductors T3e, T1e connecting respectively to Pins T3, T1 of the jack 10 (in the following descriptions, the extension conductor will be represented by "e" suffixed to the pin, such as T3e). In the practical embodiments, the extension conductors T3e, T1e are laid on the surface of the circuit board 20 as shown in FIGS. 2A and 2B which is an example for a patch panel circuit board 20 with eight sets of jacks 10 and eight sets of IDCs 30.

3. The inductor structure connecting to the IDC 30: it is formed by extending a section of a pair of parallel conductors connecting to two contacts of the IDC 30 with TR polarity. It may be formed by the following two circuit designs. FIG. 1A shows the first design. A second inductor 52a is formed by a section of extension conductors IT3e, IR1e connecting respectively to contacts IT3, IR1 of the IDC 30 (with the circuit layout on the circuit board 20 shown in FIGS, 2A and 2B). FIG. 1B shows the second design. A second inductor 52b is formed by a section of extension conductors IT1e, IR3e connecting respectively to contacts IT1, IR3 of the IDC 30.

Figure 3B:
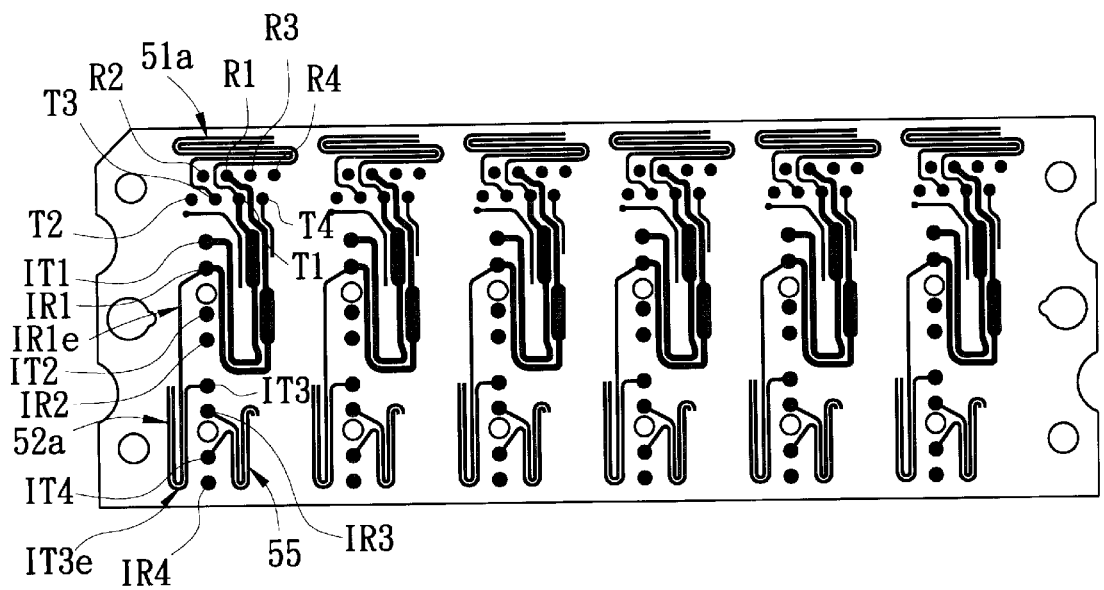
FIG. 3B is a fragmentary circuit layout according to FIG. 1, showing a circuit layout on a negative side of the circuit board.
Figure 3A:
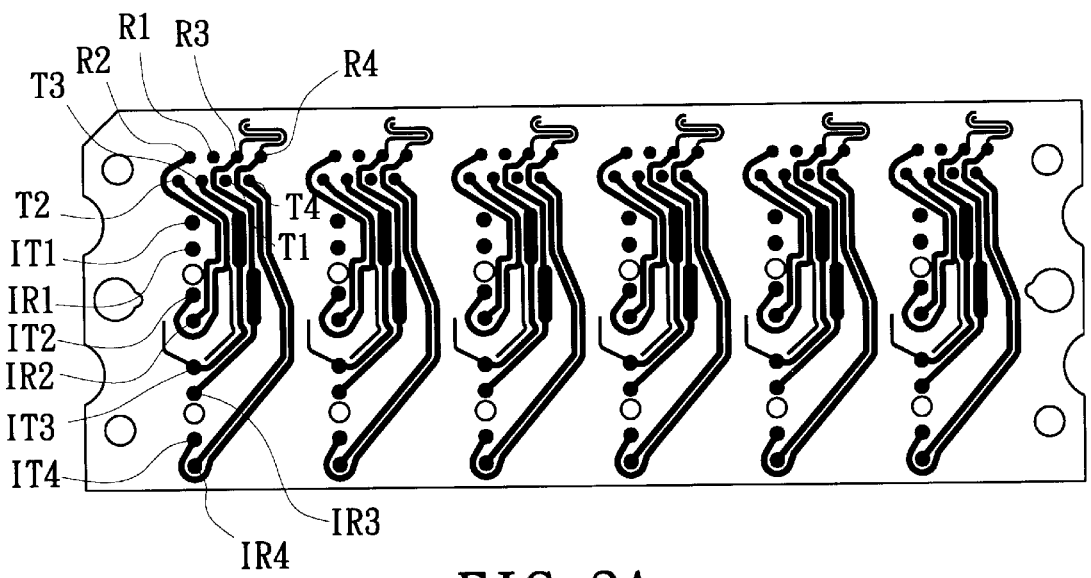
FIG. 3A is a fragmentary circuit layout according to FIG. 1, showing a circuit layout on a positive side of the circuit board.

Based on actual utilization of the circuit board 20, two types of IDC 30 layout may be adopted. FIGS. 2A and 2B show one type in which a plurality of IDCs 30 are linked from heads to tails and juxtaposed on the same circuit board 20. FIGS. 3A and 3B show another type in which a plurality of IDCs 30 are spaced and juxtaposed in parallel on the same circuit board 20.

The connection and polarity relationships between the capacitors and inductors and the jack 10 and the IDC 30 of the first embodiment set forth above are summarized in Table 3 below:

TABLE 3

| | Conductor Connection/Polarity | Location |
|---|---|---|
| First Capacitor 41 | T3,T1/TT | Main Conductor 203,205 |
| Second Capacitor 42 | R3,R1/RR | Main Conductor 206,204 |
| First Inductor 51a | T3,T1/TT | Extension Conductor T3e,T1e |
| Second Inductor 52a (FIG. 1A) or | IT3,IR1/TR | Extension Conductor IT3e,IR1e |
| Second Inductor 52b (FIG. 1B) | IT1,IR3/TR | Extension Conductor IT1e,IR3e |

Figure 4A:
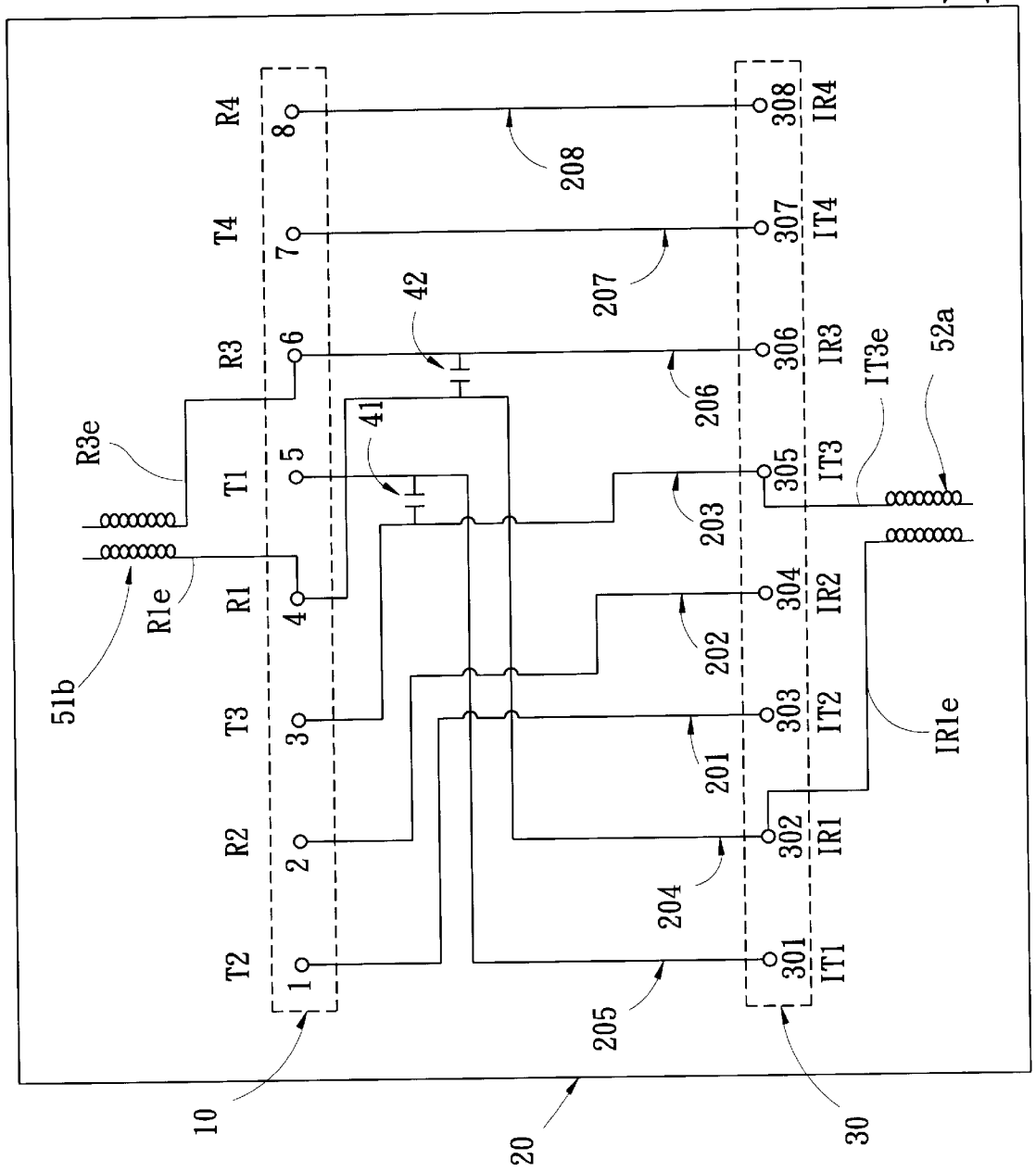
FIGS. 4A and 4B are equivalent circuit diagrams of a second embodiment of the invention.
Figure 4B:
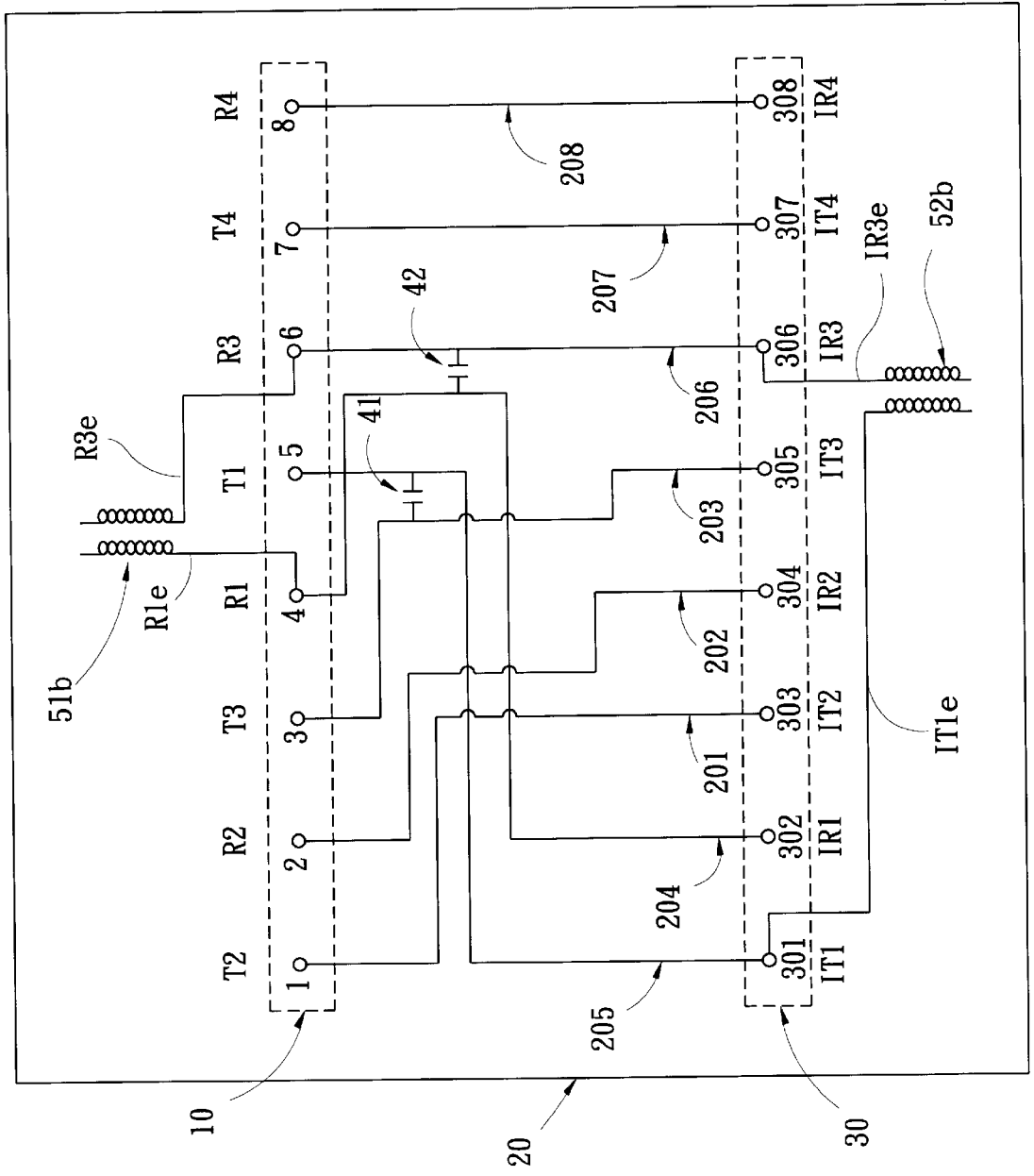

Referring to FIGS. 4A and 4B for the second embodiment:

This embodiment keeps the first and second capacitors 41, 42 of the first embodiment, however the first inductor 51a with polarity TT is changed to the first inductor 51b with polarity RR. The connection and polarity relationships between the capacitors and inductors and the jack 10 and the IDC 30 of the second embodiment are summarized in Table 4 below:

TABLE 4

| | Conductor Connection/Polarity | Location |
|---|---|---|
| First Capacitor 41 | T3,T1/TT | Main Conductor 203,205 |
| Second Capacitor 42 | R3,R1/RR | Main Conductor 206,204 |
| First Inductor 51b | R3,R1/RR | Extension Conductor R3e,R1e |
| Second Inductor 52a (FIG. 4A) or | IT3,IR1/TR | Extension Conductor IT3e,IR1e |
| Second Inductor 52b (FIG. 4B) | IT1,IR3/TR | Extension Conductor IT1e,IR3e |

Figure 5A:
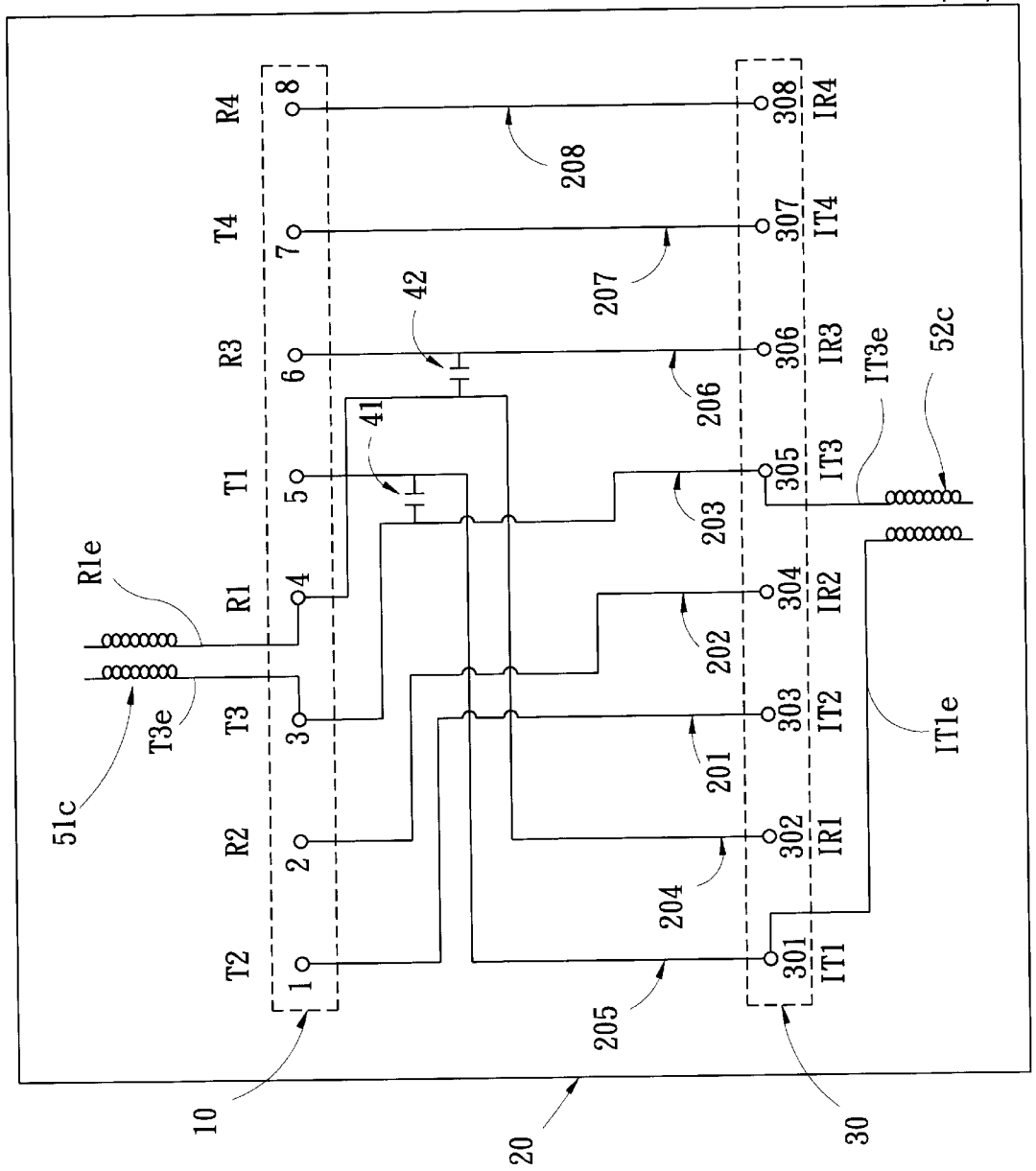
FIGS. 5A and 5B are equivalent circuit diagrams of a third embodiment of the invention.
Figure 5B:
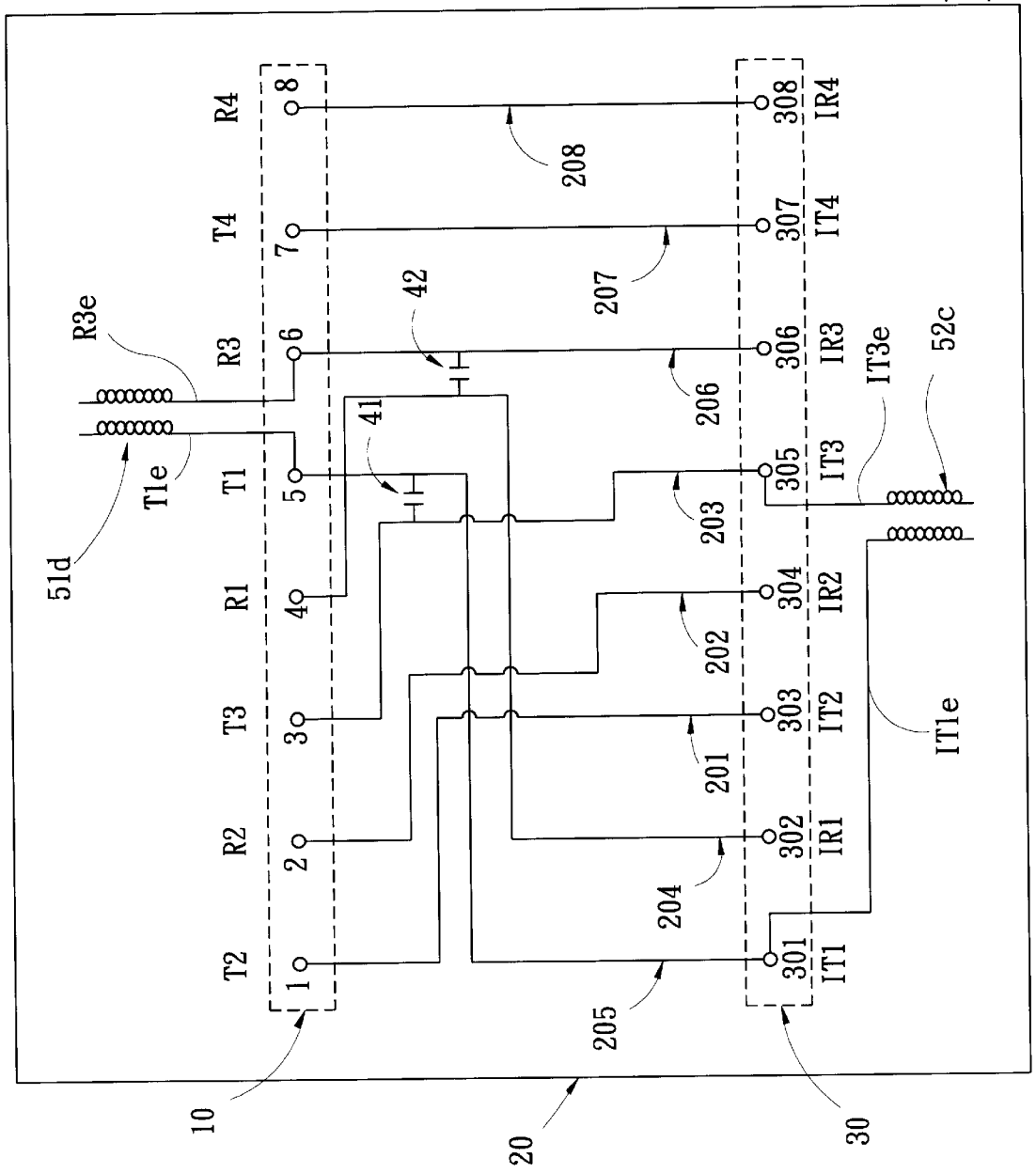

Referring to FIGS. 5A and 5B for the third embodiment:

This embodiment still keeps the first and second capacitors 41, 42 of the first and second embodiment, however the polarity of the first inductor is changed to TR, and the polarity the second inductor is changed to TT. The connection and polarity relationships between the capacitors and inductors and the jack 10 and the IDC 30 of the third embodiment are summarized in Table 5 below:

TABLE 5

| | Conductor Connection/Polarity | Location |
|---|---|---|
| First Capacitor 41 | T3,T1/TT | Main Conductor 203,205 |
| Second Capacitor 42 | R3,R1/RR | Main Conductor 206,204 |
| First Inductor 51c (FIG. 5A) or | T3,R1/TR | Extension Conductor T3e,R1e |
| First Inductor 51d (FIG. 5B) | T1,R3/TR | Extension Conductor T1e,R3e |
| Second Inductor 52c | IT3,IT1/TT | Extension Conductor IT3e,IT1e |

Figure 6A:
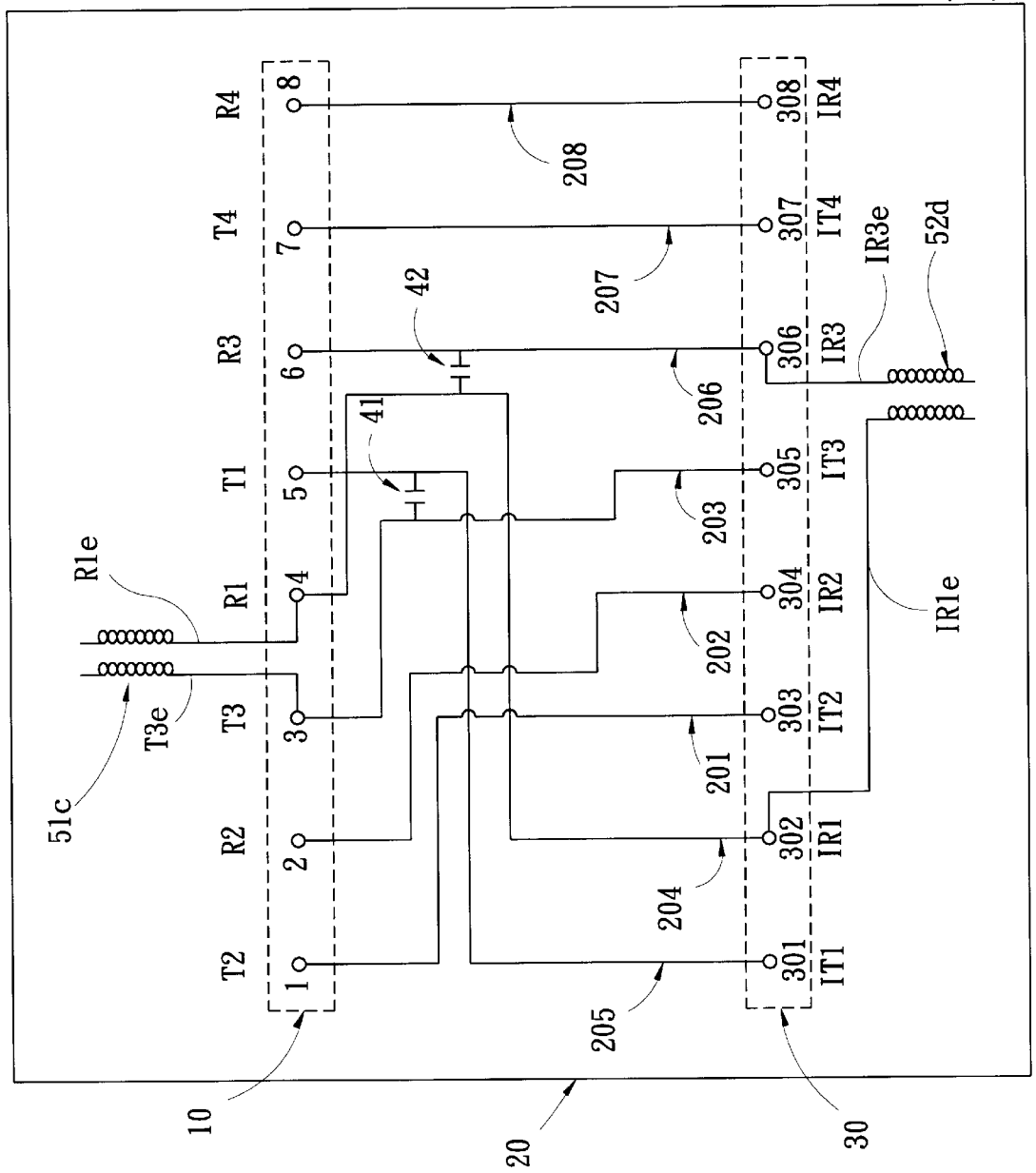
FIGS. 6A and 6B are equivalent circuit diagrams of a fourth embodiment of the invention.
Figure 6B:
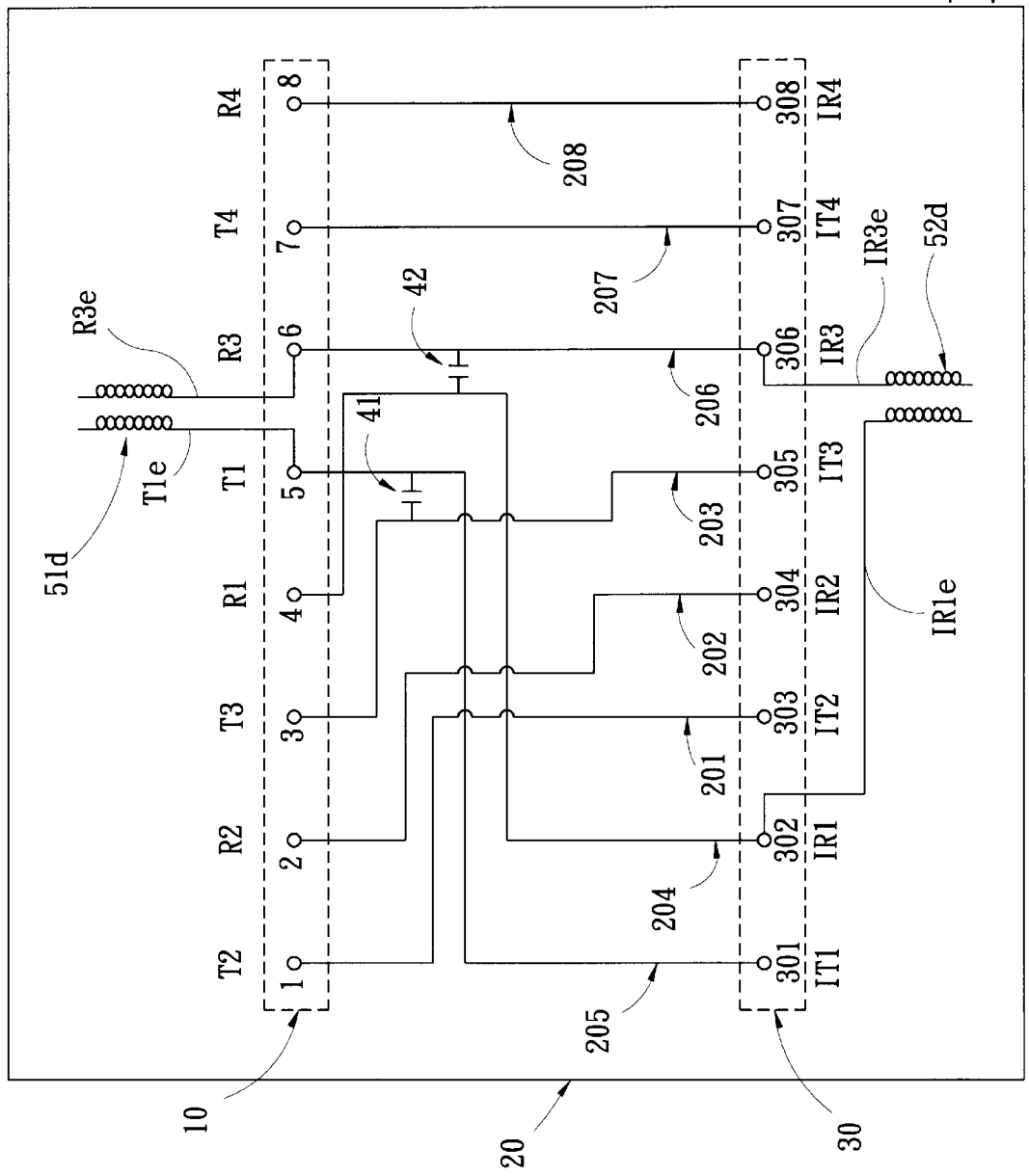

Referring to FIGS. 6A and 6B for the fourth embodiment:

This embodiment still keeps the first and second capacitors 41, 42 of the first and second embodiments, however the polarity of the first inductor is changed to TR, and the polarity the second inductor is changed to RR. The connection and polarity relationships between the capacitors and inductors and the jack 10 and the IDC 30 of the fourth embodiment are summarized in Table 6 below:

TABLE 6

| | Conductor Connection/Polarity | Location |
|---|---|---|
| First Capacitor 41 | T3,T1/TT | Main Conductor 203,205 |
| Second Capacitor 42 | R3,R1/RR | Main Conductor 206,204 |
| First Inductor 51c (FIG. 6A) or | T3,R1/TR | Extension Conductor T3e,R1e |
| First Inductor 51d (FIG. 6B) | T1,R3/TR | Extension Conductor T1e,R3e |
| Second Inductor 52d | IR3,IR1/RR | Extension Conductor IR3e,IR1e |

While the preferred embodiments of the invention have been set forth for the purpose of disclosure, modifications of the disclosed embodiments of the invention as well as other embodiment thereof may occur to those skilled in the art. Accordingly, the appended claims are intended to cover all embodiments which do not depart from the spirit and scope of the invention.

What is claimed is:

1. A circuit board coupled with jacks having a plurality of conductors laid on two sides thereof for connecting a plurality of pins of a jack with a plurality of contacts of an Insulation Displacement Connector (IDC) mounted to the circuit board which is conformed to Category 6 standard, the circuit board comprising:

a first capacitor and/or a second capacitor respectively formed by coupling a first pair main conductors connected to the jack and the IDC laid on one side of the circuit board with a third pair main conductors laid on another side of the circuit board;

a first inductor formed by a pair of parallel extension conductors connecting to two sets of the pins of the jack and having a TT or RR polarity layout; and a second inductor formed by a pair of parallel extension conductors connecting to the contacts of the IDC and having a TR polarity layout.

2. The circuit board coupled with jacks of claim 1, wherein the first pair main conductors include a fifth main conductor connecting to pin 5 of the jack and a fourth main conductor connecting to pin 4 of the jack; the third pair main conductors including a third main conductor connecting to pin 3 of the jack and a sixth main conductor connecting to pin 6 of the jack.

3. The circuit board coupled with jacks of claim 2, wherein the main conductors connecting to the pin 3 and the pin 5 are coupled to form a first capacitor, and the main conductors connecting to the pin 6 and the pin 4 are coupled to form a second capacitor.

4. The circuit board coupled with jacks of claim 1, wherein one of the extension conductors of the first inductor connects to pin 3 of the jack and another extension conductor of the first inductor connects to pin 5 of the jack to form the first inductor with a TT polarity layout.

5. The circuit board coupled with jacks of claim 1, wherein one of the extension conductors of the first inductor connects to pin 6 of the jack and another extension conductor of the first inductor connects to pin 4 of the jack to form the first inductor with a RR polarity layout.

6. The circuit board coupled with jacks of claim 1, wherein one of the extension conductors of the second inductor connects to contact 5 of the IDC and another extension conductor of the second inductor connects to contact 2 of the IDC to form the second inductor with a TR polarity layout.

7. The circuit board coupled with jacks of claim 1, wherein one of the extension conductors of the second inductor connects to contact 1 of the IDC and another extension conductor of the second inductor connects to contact 6 of the IDC to form the second inductor with a TR polarity layout.

8. A circuit board coupled with jacks having a plurality of conductors laid on two sides thereof for connecting a plurality of pins of a jack with a plurality of contacts of an Insulation Displacement Connector (IDC) mounted to the circuit board which is conformed to Category 6 standard, the circuit board comprising:

- a first capacitor and/or a second capacitor respectively formed by coupling a first pair main conductors which connect the jack and the IDC laid on one side of the circuit board with a third pair main conductors laid on another side of the circuit board;
- a first inductor formed by a pair of parallel extension conductors connecting to two sets of the pins of the jack and having a TR polarity layout; and
- a second inductor formed by a pair of parallel extension conductors connecting to the contacts of the IDC and having a TT or RR polarity layout.

9. The circuit board coupled with jacks of claim 8, wherein the first pair main conductors include a fifth main conductor connecting to pin 5 of the jack and a fourth main conductor connecting to pin 4 of the jack; the third pair main conductors including a third main conductor connecting to pin 3 of the jack and a sixth main conductor connecting to pin 6 of the jack.

10. The circuit board coupled with jacks of claim 9, wherein the main conductors connecting to the pin 3 and the pin 5 are coupled to form a first capacitor, and the main conductors connecting to the pin 6 and the pin 4 are coupled to form a second capacitor.

11. The circuit board coupled with jacks of claim 8, wherein one of the extension conductors of the first inductor connects to pin 3 of the jack and another extension conductor of the first inductor connects to pin 4 of the jack to form the first inductor with a TR polarity layout.

12. The circuit board coupled with jacks of claim 8, wherein one of the extension conductors of the first inductor connects to pin 5 of the jack and another extension conductor of the first inductor connects to pin 6 of the jack to form the first inductor with a TR polarity layout.

13. The circuit board coupled with jacks of claim 8, wherein one of the extension conductors of the second inductor connects to contact 5 of the IDC and another extension conductor of the second inductor connects to contact 1 of the IDC to form the second inductor with a TT polarity layout.

14. The circuit board coupled with jacks of claim 8, wherein one of the extension conductors of the second inductor connects to contact 6 of the IDC and another extension conductor of the second inductor connects to contact 2 of the IDC to form the second inductor with a RR polarity layout.

* * * * *